United States Patent [19]

Offermann

[11] 3,988,588

[45] Oct. 26, 1976

[54] HIGH ENERGY ELECTRON IRRADIATION OF FLOWABLE MATERIALS

[75] Inventor: Bernd Peter Offermann, Hamburg, Germany

[73] Assignee: Licentia Patent-Verwaltungs-G.m.b.H., Frankfurt am Main, Germany

[22] Filed: May 16, 1975

[21] Appl. No.: 578,251

Related U.S. Application Data

[62] Division of Ser. No. 419,543, Nov. 28, 1973, Pat. No. 3,891,855.

[30] Foreign Application Priority Data

Nov. 29, 1972 Germany........................... 2258393

[52] U.S. Cl............................................. 250/492 B

[51] Int. Cl.$^2$......................................... H01J 37/06

[58] Field of Search................. 250/492 B, 436, 398

[56] References Cited

UNITED STATES PATENTS

| | | | |
|---|---|---|---|
| 2,340,890 | 2/1944 | Lang et al. | 250/436 |
| 2,921,006 | 1/1960 | Schmitz et al. | 250/398 |
| 3,655,965 | 4/1972 | Icre et al. | 250/492 B |

*Primary Examiner*—Alfred E. Smith

*Assistant Examiner*—Bruce C. Anderson

*Attorney, Agent, or Firm*—Spencer & Kaye

[57] ABSTRACT

In order to efficiently irradiate a flowable material with high energy electrons, a hollow body is disposed in a container for the material and the material is caused to flow in the form of a thin layer across a surface of the body from or to the interior of the container while the material flowing across the body surface is irradiated.

6 Claims, 5 Drawing Figures

HIGH ENERGY ELECTRON IRRADIATION OF FLOWABLE MATERIALS

CROSS REFERENCE TO RELATED APPLICATION

This application is a division of application Ser. No. 419,543, filed Nov. 28th, 1973 now U.S. Pat. No. 3,891,855.

BACKGROUND OF THE INVENTION

The present invention relates to the irradiation with high energy electrons of flowable material in a hollow body, the flowable material being in the form of granules, powders, or more or less viscous liquids.

U.S. Pat. No. 3,133,828 discloses a paint spraying device for automobile bodies in which the automobile bodies are on a conveyor belt and initially pass through a spray chamber and then a heating chamber. The paint sprayed onto the bodies is irradiated with electrons before the spraying process. For this purpose, a Van de Graaf generator is provided which includes an electrostatic transmission generator and an acceleration tube. The acceleration tube opens into a magnetic deflection system which is in mechanically fixed connection with a so-called scanning horn. The electrons exit through the exit window of the scanning horn and impinge on a tube which is flattened in the irradiation region and which mechanically connects a paint reservoir with the spray nozzles disposed in the spray chamber. The entire device results in the paint liquid being irradiated with electrons only very shortly before application to the automobile bodies while it flows through the flattened tube.

One drawback of this system is, however, that the irradiation device and the associated shielding require a relatively large amount of space.

SUMMARY OF THE INVENTION

It is the object of the present invention to reduce the space required for an installation for irradiating flowable materials such as liquids, granulates, powdery substances and more or less highly viscous media with high energy electrons.

Another object of the invention is to permit a high material output to be achieved in a system which is as compact as possible.

These and other objects according to the present invention are achieved by disposing a hollow body in a box or container, which serves as a collector for the product to be irradiated and by providing a mechanical arrangement which causes the product to be irradiated to flow out of the box via the inner or outer walls of the hollow body and delivers the irradiated product to a container, which may be the box or an additional container. An irradiation device is disposed within or outside of the hollow body for irradiating the product while it flows along the walls of the hollow body.

In apparatus according to the present invention, the hollow body is a funnel disposed in a box so that the top of the funnel is lower than the top of the box. The bottom of the funnel is provided with an exit opening and is mechanically permanently connected with a discharge pipe passing through the bottom wall of the box in a liquid-tight manner. The box is connected, via a pipeline and a pump, with a reservoir containing the product to be irradiated and the pump pumps exactly the right amount of product into the box so that the product runs down the inner surface of the funnel walls in a continuous, uniform stream.

In a further embodiment of the present invention, a hollow body is mounted to be rotated about its vertical axis and is disposed in a box so that the top of this hollow body is lower than the upper extremity of the side walls of the box. The box is connected with a discharge pipe and the hollow body is connected in the region of its bottom with an input pipe which passes through the bottom wall of the box in a liquid-tight manner. The product to be irradiated can be fed to the hollow body via the input pipe and, due to the centrifugal forces produced by the rotation of the hollow body, the product to be irradiated flows up the inner walls of the hollow body and passes over the upper edge of the hollow body into the box. In this device, it is advisable to cover the box with a lid. The rotatable hollow body may be of conical or cylindrical form. In the case of a conical, or funnel-shaped body, its walls diverge upwardly, i.e., its large diameter base is toward the top.

A further embodiment of the present invention is one in which the hollow body is a double walled funnel or cylinder which is permanently mounted in a box. The box has a discharge pipe and a pump pumps the product to be irradiated through a pipeline into the hollow chamber formed between the two walls of the funnel or cylinder to flow from top to bottom, or vice versa.

Also within the scope of the present invention is a funnel which is arranged in a box with its tip, or small diameter end, pointing upward and in which the product to be irradiated can be pumped through the interior of the funnel from the bottom to the top, passes out of the funnel top opening, and is irradiated with the aid of an irradiation device while it flows down the outer walls of the funnel.

In a further embodiment of the present invention, use is made of an irradiation device having either a circular, rectangular or linear electron discharge window.

An advantage of the present invention is that, due to the simple, compact and space-saving construction of the irradiation devices, these devices can be shielded relatively easily and provide simple and dependable product guidance.

A further advantage is that it permits the material to be processed at a high volume flow rate. The use of an irradiation device having a circular, annular electron exit window will result in about three times the electron beam exit output with the same space requirement as when an irradiating device with a rectangular or linear exit window is used.

DESCRIPTION OF THE PREFERRED EMBODIMENTS

Figure 1:
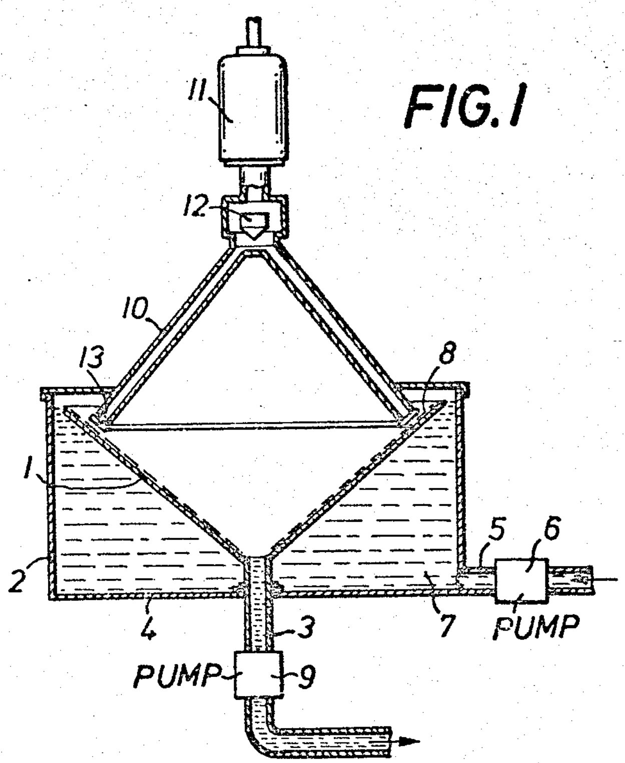
FIG. 1 is an elevational, cross-sectional view of one preferred embodiment of the invention employing a funnel-type device permanently mounted in a box and an irradiating device having a circular, annular electron discharge window.

In the embodiment shown in FIG. 1, a funnel-shaped, or conical, hollow body 1 is mechanically, fixedly and permanently mounted in a box, or container 2. The neck of the funnel defined by the hollow body has an opening and is mechanically permanently connected with a discharge pipe 3, which passes through the bottom 4 of box 2 in a sealed liquid-tight manner. A pipe 5 which is connected via a pump 6 with a reservoir (not shown) for the product 7 to be irradiated opens into the lower region of box 2.

The product 7 may be a liquid, a granulate, a powder, or a more or less highly viscous, still flowable medium. With the aid of pump 6, the liquid level in box 2 is kept constant, i.e., pump 6 pumps exactly the right amount of product 7 from the reservoir into the box 2 so that the product 7 flows down the inside surface 8 of funnel 1 as a continuous stream having the form of a sheet of uniform thickness. In order to assure this form of continuous flow of the product 7 from funnel 1, a further pump 9 is provided in the discharge pipe 3. The discharge pipe 3 may lead either to the box 2 which serves as the reservoir or to an additional container. In the first case a simple mass of material would be irradiated a plurality of times. This is advisable, if the irradiation device 10 is only suitable for low electron beam outputs, because in this way the whole material can be completely irradiated. The irradiated material can be conveyed away from the treatment apparatus with the aid of a further pipe, which is connected via a chock with the discharge pipe 3 (not shown).

The product 7 is irradiated with the aid of an irradiation device while it flows down the inside 8 of funnel 1. The irradiation device 10 may be an electron deflector horn which is suitable for high electron beam outputs.

A suitable known irradiation device which could be employed is described in the journal "PVP June 1967; Curing Coating By Electron Irradiation."

The electron deflector horn has an electron accelerator 11 including an electron source and an electron deflection system 12 which, by means of superimposed magnetic and/or electric fields, directs the electrons to an electron discharge window 13 which separates the vacuum chamber of the electron accelerator from the ambient atmospheric pressure. The electron discharge window 13 is designed in the form of a circular ring, or annulus, and is mechanically fastened to the electron horn without the aid of auxiliary supports.

Figure 3:
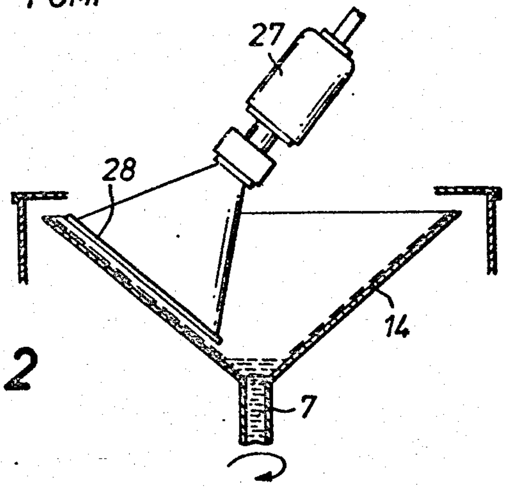
FIG. 3 is a similar view of a portion of a further embodiment employing the rotatable funnel of the type shown in FIG. 2 and an irradiation device which has a rectangular or linear electron discharge window.

Instead of the above-described electron deflector horn, it is also possible to use an irradiation device having a rectangular or linear electron discharge window, as described for example in connection with the embodiment illustrated in FIG. 3.

Figure 2:
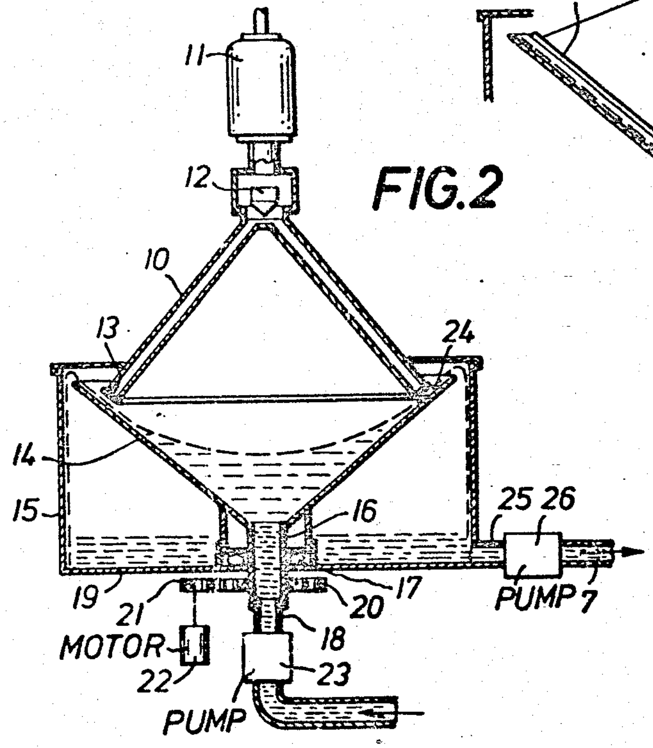
FIG. 2 is a view similar to that of FIG. 1 of an embodiment employing a funnel-shaped device rotatably arranged in a box and an irradiating device having a circular, annular electron discharge window.

In the embodiment shown in FIG. 2, a funnel 14 is disposed in a box 15 and is mounted to be rotatable about its vertical axis. The neck of the funnel 14 has an opening and is mechanically permanently connected with a tubular support 16. The tubular support 16 is rotatably mounted in an inpput pipe 18 with the aid of a liquid-tight joint 17. The tubular support 16 passes through the bottom 19 of box 15 in a liquid-tight manner. A drive wheel 20 is fastened to the tubular support 16 preferably outside of box 15 and is driven via gear 21 by a motor 22. The drive wheel 20 may be an outwardly toothed ring of teeth and the gear 21 may be a pinion permanently disposed on the shaft of motor 22. The wheel 20 can be fastened to the tubular support 16 with the aid of screws or feather keys and grooves. The liquid-tight joint 17 can have a thrust ball bearing, which is laterally guided and sealed.

In order to irradiate the product 7, the drive system constituted by motor 22, gear 21 and drive wheel 20 causes funnel 14 to undergo a constant speed rotation about its vertical axis. At the same time, a product 7 is fed into the bottom of the funnel via input pipe 18 and tubular support 16 by means of a pump 23 which is disposed in line with pipe 18. Due to the centrifugal forces produced by the rotation of funnel 14, the product 7 rises on the inner walls of the funnel, passes over the upper edge of the funnel and then enters into box 15 proper. The irradiation takes place as the product 7 is rising along the funnel wall and is effected by an irradiation device 10 which has an electron exit window 13 in the form of a circular ring and which is identical to the irradiation device of FIG. 1. In order for the irradiated product 7 to flow out of box 15, the latter is mechanically permanently connected with a discharge pipe 25 which is in line with a pump 26, in order to produce uniform outflow of product 7. In this device, it is advisable to cover box 15 with a lid so that the irradiated product 7 can not flow above the side walls of box 15.

Instead of an irradiation device 10 with the circular, annular electron exit window 13, an irradiation device 27 with a rectangular or linear electron exit window 28, as shown in FIG. 3, can be used. These windows are made as thin as possible and have a large area so that as little energy as possible of the electrons exiting through the window is absorbed by the window itself. The design of the window is mainly dependent on the material properties, particularly the tensile strength, of the window materials employed. The materials employed are predominantly thin light metal foils.

The hollow bodies in the embodiments shown in FIGS. 2 and 3 may be cylindrical bodies instead of the funnels shown. It is also possible to convey the product through a double walled hollow body, e.g., a funnel or cylinder, from the bottom to the top or from the top to the bottom by means of a pump.

It is also possible to turn the funnel around so that the material to be irradiated is pumped through the funnel from its bottom to its neck, passes through the neck, and is irradiated as it flows down over the outer wall surface of the funnel.

Figure 4:
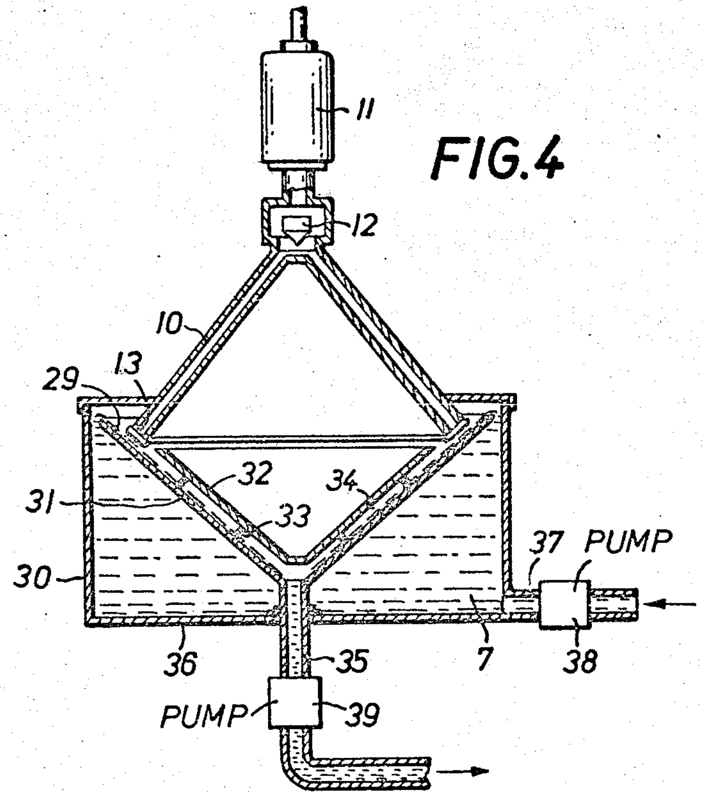
FIG. 4 is a view similar to that of FIG. 1 of an embodiment employing a double-walled funnel-device permanently mounted in a box and an irradiating device having a circular, annular electron discharge window.

In the embodiment shown in FIG. 4, a funnel-shaped, or conical, double-walled hollow body 29 is mechanically, fixedly and permanently mounted in a box or container 30. The outer body portion 31 and the inner body portion 32 are connected to one another by webs 33. They form a conical cavity 34. The neck of the outer body portion 31 has an opening and is mechanically permanently connected with a discharge pipe 35, which passes through the bottom 36 of box 30 in a sealed liquid-tight manner. A pipe 37 which is connected via a pump 38 with a reservoir (not shown) for the product 7 to be irradiated opens into the lower region of box 30.

Instead of the above-described funnel-shaped or conical, double-walled hollow body 29, it is also possible to use a cylindrical double-walled hollow body.

With the aid of pump 38, the liquid level in box 30 is kept constant, i.e., pump 38 pumps exactly the right amount of product 7 from the reservoir into the box 30 so that the product 7 flows down through the cavity 34 of the double-walled hollow body 29 as a continuous stream having the form of a sheet of uniform thickness. In order to assure this form of continuous flow of the product 7 from hollow body 29, a further pump 39 is provided in the discharge pipe 35. It is also possible to pump the product 7 to be irradiated with the aid of pump 39 via pipe 35 in the cavity 34 of the double-walled hollow body 29. In this case pump 38 pumps the irradiated product 7 via pipe 37 out of box 30.

The product 7 is irradiated in the superior region of the double-walled hollow body 29 with the aid of an irradiation device 10 while it flows through the cavity 34. The irradiation device may be an electron deflector horn which has an electron accelerator 11 including an electron source, an electron deflection system 12 and an electron discharge window 13 which separates the vacuum chamber of the electron accelerator from the ambient atmospheric pressure. The inner body portion 32 of the hollow body 29 is shorter than the outer body portion 31 so that the electron discharge window 13 can be arranged in the superior region of a funnel, which is formed by the outer portion 31.

Figure 5:
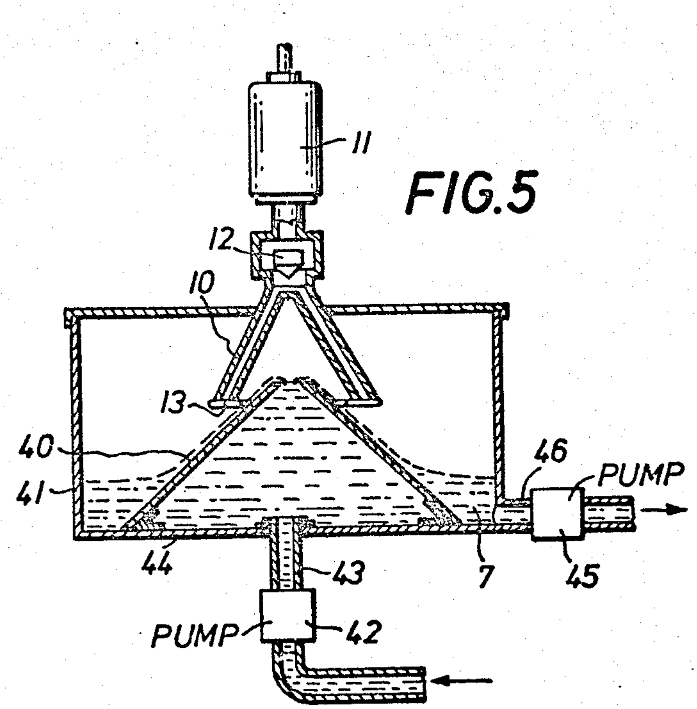
FIG. 5 is an elevational, cross-sectional view of an embodiment employing a funnel-type device being open at both ends and having its smaller-diameter opening directed upwardly permanently mounted in a box and an irradiating device having a circular, annular electron discharge window.

In the embodiment shown in FIG. 5 a hollow conical body 40 is disposed in a container 41. The body 40 is open at both ends and has its smaller-diameter opening directed upwardly. The product 7 to be irradiated is pumped with the aid of a pump 42 via a pipe 43 which passes through the bottom 44 of container 41 in a sealed liquid-tight manner into the cavity of body 40. It moves upwardly, overflows the upper end of body 40 and flows down the outer wall surface of said body. The product 7 is irradiated by an irradiation device 10 while it flows down the outer wall surface of the hollow conical body 40. The irradiation device 10 has an electron accelerator 11 including an electron source, an electron deflecting system 12 and an electron discharge window 13. The irradiated product 7 flows in the container 41, which is connected via a discharge pipe 46 and a pump 45 with a reservoir (not shown). Pipe 46 is arranged in the lower region of container 41.

The circular, annular electron discharge windows of the applied irradiation devices in the above described embodiments of the invention have a medium diameter of nearly 1 m. The height of the irradiation devices which are provided for an electron energy level of 1 MeV and for an electron supply rate of nearly 50 KW reaches nearly 0,85 m. The dimensions of the applied funnels effect a volume flow rate of the material being irradiated of about 30 m3/h. For this volume flow rate the rotatable funnel 14 in FIG. 2 rotates at nearly 200 rpm.

It will be understood that the above description of the present invention is susceptible to various modifications, changes and adaptations, and the same are intended to be comprehended within the meaning and range of equivalents of the appended claims.

I claim:

1. Apparatus for irradiating a flowable material with high energy electrons, comprising, in combination: a container for holding a quantity of such material; a hollow body of circular cross section which is open at both ends and which is disposed in said container with the longitudinal axis of said body oriented vertically and the upper end of said body at a lower elevation than the top of said container; means supporting said body for rotation about its vertical axis; inlet conduit means connected to the lower end of said body for delivering material into the region enclosed by said body, said conduit means passing through the bottom of said container in a liquid-tight manner; outlet conduit means connected to said container for conveying material away from said container; means connected to said body for rotating it about its vertical axis at a rate sufficient to cause flowable material introduced by said inlet conduit means into the lower portion of said body to flow upwardly along the inner wall surface of said body under the influence of centrifugal force and to flow over the upper edge of said body and into said container; and irradiation means disposed for irradiating such material with high energy radiation as the material flows up said inner wall surface of said body.

2. An arrangement as defined in claim 1 further comprising a lid closing the top of said container.

3. An arrangement as defined in claim 1 wherein said body has a conical shape.

4. An arrangement as defined in claim 1 wherein said body has a cylindrical shape.

5. An arrangement as defined in claim 1 wherein said irradiation means comprises an annular electron exit window.

6. An arrangement as defined in claim 1 wherein said irradiation means comprises a rectangular or linear electron exit window.

* * * * *